United States Patent [19]
Van De Walle et al.

[11] Patent Number: 5,583,436
[45] Date of Patent: Dec. 10, 1996

[54] MINIATURE MAGNETIC FIELD SENSOR WITH COMPACT MAGNETIZATION COIL

[75] Inventors: Gerjan F. A. Van De Walle; Franciscus P. Widdershoven, both of Eindhoven, Netherlands

[73] Assignee: U.S. Philips Corporation, New York, N.Y.

[21] Appl. No.: 389,370

[22] Filed: Feb. 16, 1995

[30] Foreign Application Priority Data

Feb. 28, 1994 [EP] European Pat. Off. .............. 94200508

[51] Int. Cl.$^6$ ..................................................... G01R 33/02
[52] U.S. Cl. ........................... 324/252; 324/260; 336/206
[58] Field of Search ............................... 324/252, 207.21, 324/234–238, 262, 260; 336/199, 200, 206; 338/32 R, 32 H

[56] References Cited

U.S. PATENT DOCUMENTS

| | | | |
|---|---|---|---|
| 4,593,245 | 6/1986 | Viertl et al. | 324/238 |
| 4,706,020 | 11/1987 | Viertl et al. | 324/262 |

FOREIGN PATENT DOCUMENTS

| | | |
|---|---|---|
| 3442278 | 10/1991 | Germany . |
| 4121374 | 1/1993 | Germany . |

OTHER PUBLICATIONS

Patent Abstracts of Japan, vol. 15, No. 511, p–1292, Abstracts of JP, A, 3-223685 (Fujitusu Ltd.), 2 Oct. 1991.
Philips, Technical Publication 268, dated Jul. 14, 1988.

*Primary Examiner*—Sandra L. O'Shea
*Assistant Examiner*—Jay M. Patidar
*Attorney, Agent, or Firm*—Robert J. Kraus

[57] ABSTRACT

A magnetic field sensor includes a number of magnetoresistive sensor elements situated in one plane, and which have the same privileged directions of magnetization, and a magnetization coil connected to a current pulse generator which alternately supplies the magnetization coil with opposite current pulses to generate a magnetic field which extends parallel to the privileged directions of the sensor elements and is strong enough to reverse the direction of internal magnetization thereof The magnetization coil includes an electrically insulating substrate which supports an approximately spiral-shaped electric conductor track including a group of parallel arranged active conductor elements. An electric current flows through the conductor track in the same direction in all active conductor elements of the relevant group. The magnetic field sensor is mounted on the substrate in the immediate vicinity of the group of active conductor elements such that the plane of the sensor elements extends substantially parallel to the plane of the active conductor elements and the privileged direction of magnetization of the sensor elements extends perpendicular to the longitudinal direction of the active conductor elements.

12 Claims, 5 Drawing Sheets

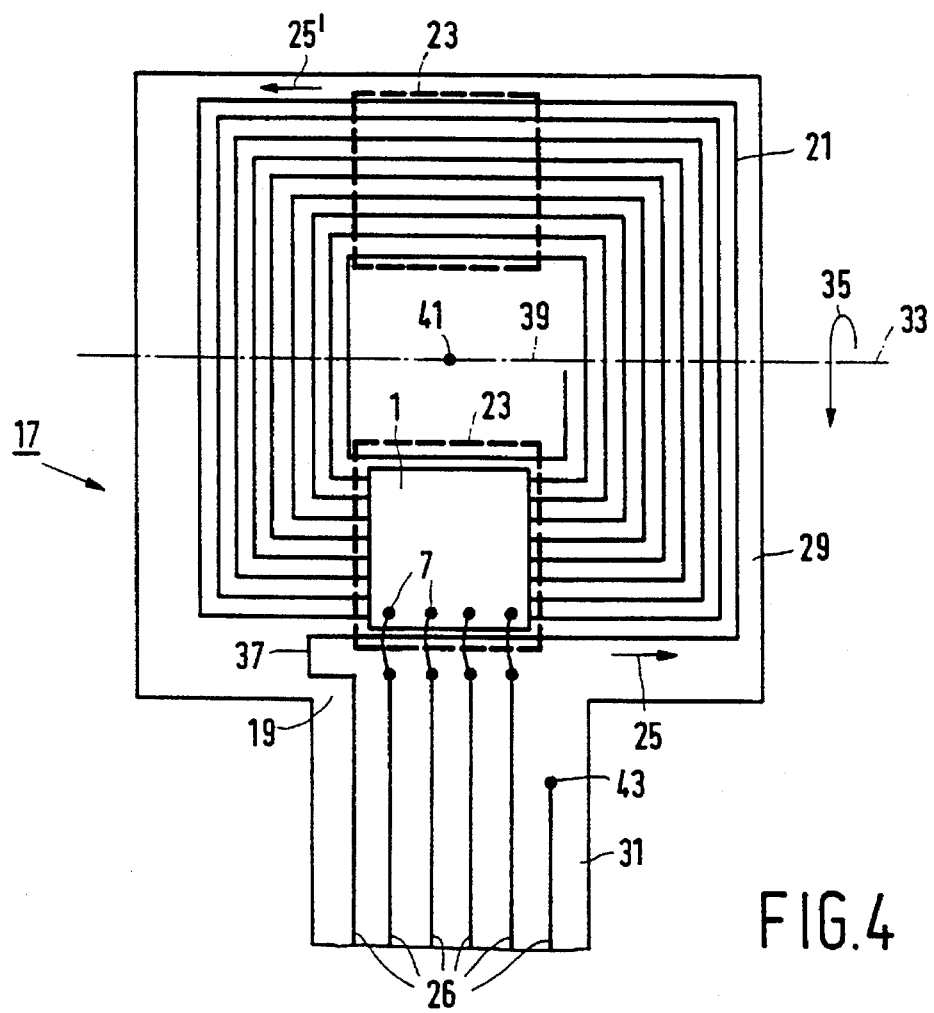
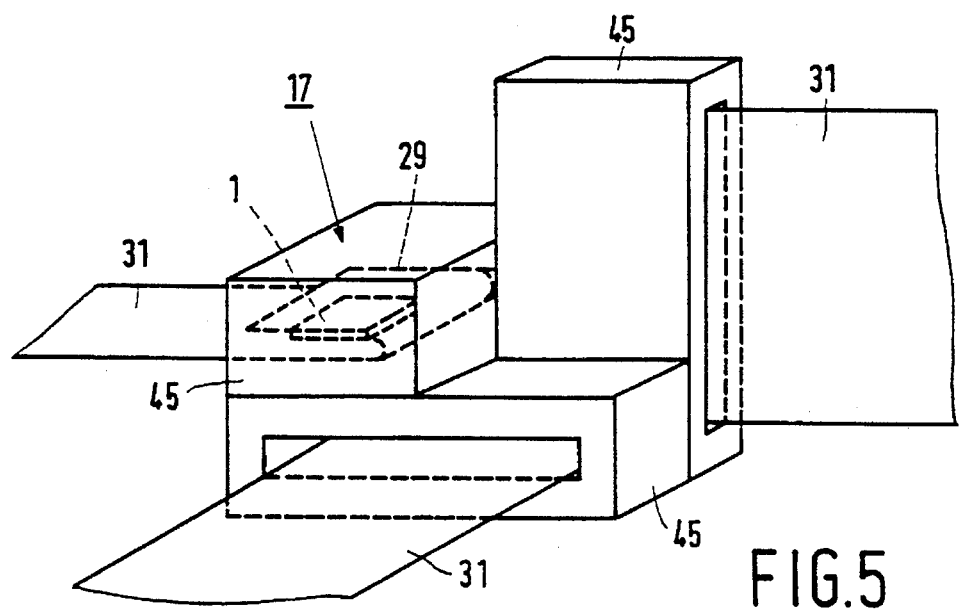

MINIATURE MAGNETIC FIELD SENSOR WITH COMPACT MAGNETIZATION COIL

This invention relates to a device for measuring magnetic fields, comprising at least one magnetic field sensor made up of a number of magnetoresistive sensor elements which are arranged in one plane and which have the same privileged directions of magnetization, said sensor elements being connected on the one side to a power supply circuit and on the other side to a signal processing circuit and, a magnetization coil which is arranged to generate an auxiliary magnetic field at the area of the magnetic field sensor (sensors) and provided in the vicinity of the magnetic field sensor.

A device of this kind is known from DE-C-34 42 278 (PHD 84.154). The magnetization coil in the known device is connected to a current pulse generator which is arranged to apply current pulses of opposite current direction to the magnetization coil in an alternative fashion, the arrangement being such that each current pulse in the magnetization coil generates a magnetic field which is parallel to the privileged directions of magnetization of the sensor elements and which is strong enough to reverse the direction of the internal magnetization of the sensor elements. The internal magnetization of the sensor elements is reversed so as to eliminate effects disturbing the measurement, for example, effects caused by manufacturing tolerances and by drift due to temperature variations. In many cases, however, it is objectionable that the magnetization coil required for this purpose is a component which is many times larger and heavier than the magnetic field sensor. Consequently, the known device is not very well suitable for applications where at least the part accommodating the magnetic field sensor must be very small and light. An example of such an application is a compass in a vehicle, for example, a car. The device then serves to determine the direction of the terrestrial magnetic field and it would be desirable to mount the magnetic field sensor outside the car body because a car body usually contains a large amount of iron so that it has a disturbing effect on the local terrestrial field. A suitable location for the sensor is, for example, the tip of an aerial mounted on the vehicle. However, the sensor and the magnetization coil coupled thereto should then be extremely small and light. The associated circuits can then be accommodated within the vehicle and hence may be larger and heavier.

SUMMARY OF THE INVENTION

It is an object of the invention to provide a device of the kind set forth in which the magnetization coil can be substantially smaller and lighter than in the known device and, moreover, can be simply and inexpensively manufactured in bulk. To achieve this, the device in accordance with the invention is characterized in that the magnetization coil comprises a substrate which is made of an electrically insulating material and on which there is provided at least one approximately spiral-shaped electric conductor track which comprises at least one group of active conductor elements, which group is formed by a number of parts of the conductor track which extend in parallel on a surface of the substrate, an electric current flowing through the conductor track having the same direction in all active conductor elements of the group, the magnetic field sensor being mounted on the substrate, in the immediate vicinity of at least one group of active conductor elements, in such a position that the plane of the sensor elements extends substantially parallel to the plane of the active conductor elements and the privileged direction of magnetization of the sensor elements extends perpendicularly to the longitudinal direction of the active conductor elements. The conductor track can be provided on the substrate by means of techniques which are known per se, for example, techniques used for the manufacture of printed circuit boards (PCBs) or of thick-film or thin-film circuits. These techniques are very suitable for manufacturing and allow for the production of very small and light components. The magnetic field generated by the active conductor elements upon application of current is directed transversely of the longitudinal direction of these elements so that it extends parallel to the privileged direction of the sensor elements.

A preferred embodiment of the device in accordance with the invention is characterized in that the substrate also comprises a number of further electric conductor tracks which constitute connection conductors for connecting the sensor elements to the power supply circuit and the signal processing circuit. In this embodiment the problem posed by the connection of the sensor elements to the associated circuits is solved without significantly increasing the volume and the weight of the sensor.

The magnetic field generated by the magnetization coil at the area of the sensor elements should have at least a minimum value which is dependent on the type of magnetic field sensor used. For a magnetic field sensor of the Philips type KMZ 10A, for example, this minimum value amounts to 3 kA/m, see Philips Technical Publication 268, page 16. Because the dimensions of the magnetic field sensor are very small, the number of active conductor elements which can be adjacently arranged in one plane in the immediate vicinity of this sensor is comparatively small. In order to exceed the minimum value of the magnetic field generated, a comparatively large current through the conductor track would then be required, for example, 1.2 A. This current intensity can be reduced in a further preferred embodiment of the device in accordance with the invention which is characterized in that at least two conductor tracks are provided on the substrate, each track comprising at least one group of active conductor elements. Corresponding groups of active conductor elements, associated with different conductor tracks, extend in mutually parallel planes which are situated to the same side of the plane of the sensor elements of a magnetic field sensor mounted in their immediate vicinity. In this embodiment the substrate may be, for example, a multi-layer PCB and the number of active conductor elements in the vicinity of the magnetic field sensor is then proportional to the number of conductor tracks on the substrate. The current intensity required in the conductor tracks, therefore, is inversely proportional to this number.

A further improvement can be achieved by an embodiment which is characterized in that the substrate is formed by a flexible foil which comprises a first part which is provided with a conductor track on at least one of its main surfaces, which conductor track comprises two groups of active conductor elements, and a second part which supports the connection conductors on at least one of its main surfaces, the magnetic field sensor being mounted on the first part of the foil in the immediate vicinity of one of the two said groups of active conductor elements, at least the first part of the foil being folded about the magnetic field sensor in such a manner that the second group is also situated in the immediate vicinity of the magnetic field sensor and the two groups of active conductor elements of one and the same conductor track extend to both sides of the plane of the sensor elements associated with the magnetic field sensor in such a manner that the direction of an electric current flowing through the conductor track in the active conductor elements of one of the two groups opposes that in the active conductor elements of the other group. In this embodiment the number of active conductor elements in the vicinity of the magnetic field sensor is twice the number of conductor elements in a comparable embodiment of a previous type. Generally speaking, the weight of a flexible foil is also substantially less than that of a rigid substrate and the volume can be substantially reduced by folding the foil.

A magnetic field sensor of the described type is sensitive to magnetic field components which are directed transversely of the privileged direction of magnetization of the sensor elements. For a magnetic compass it is generally desirable to measure the terrestrial magnetic field in two or three mutually perpendicular directions. Therefore, a further embodiment of the device in accordance with the invention is characterized in that the device comprises two or three substrates, on each substrate there being mounted a respective magnetic field sensor, the magnetic field sensors being oriented relative to one another in a manner such that the privileged directions of the sensor elements of the magnetic field sensors extend in mutually perpendicular directions.

In the latter embodiment a respective substrate is provided for each magnetic field sensor. For the measurement of magnetic fields in two mutually perpendicular directions a further reduction of the sensor part of the device can be achieved by utilizing an embodiment which is characterized in that the substrate is formed by a flexible foil which comprises a first part which supports, on at least one of its main surfaces, a conductor track which extends approximately like a rectangular spiral and which comprises four groups of active conductor elements, the first and the second group being situated near adjoining first and second sides of the rectangle, the third and the fourth group being situated near third and fourth sides of the rectangle, the latter sides being situated opposite the first and the second side, respectively, the conductor elements in each of the groups extending parallel to the associated side of the rectangle, the flexible foil also comprising a second part which supports the connection conductors on at least one of its main surfaces, a first and a second magnetic field sensor being mounted on the foil in the immediate vicinity of the first and the fourth group of active conductor elements, respectively, at least the first part of the foil being folded about the magnetic field sensors along a diagonal of the rectangle in a manner such that the second group of active conductors is situated in the immediate vicinity of the first magnetic field sensor and the third group of active conductors is situated in the immediate vicinity of the second magnetic field sensor, the two groups of active conductor elements of one and the same conductor track which are situated near the same magnetic field sensor then extending to both sides of the plane of the sensor elements associated with the relevant magnetic field sensor in such a manner that the direction of an electric current flowing through the conductor track in the active conductor elements of one of the two groups opposes that in the active conductor elements of the other group. In this embodiment only one substrate is required for two magnetic field sensors.

It has also been found that it is possible to utilize only a single substrate for three magnetic field sensors which are sensitive in mutually perpendicular directions. This is possible in an embodiment which is characterized in that the substrate is formed by a flexible foil which comprises a first part which supports, on at least one of its main surfaces, a conductor track which extends approximately like a rectangular spiral and which comprises six groups of active conductor elements. The first and the second group are situated near oppositely situated points of oppositely situated first and third sides of the rectangle with the third and the fourth group also being situated near oppositely situated points of the first and third sides of the rectangle, whereas the fifth and the sixth group are situated near a fourth side of the rectangle in such a manner that they are symmetrical relative to a first center line of the rectangle which extends parallel to the first side. The conductor elements in each of the groups extend parallel to the associated side of the rectangle, the flexible foil also comprising a second part which supports the connection conductors on at least one of its main surfaces. A first, a second and a third magnetic field sensor are mounted on the foil in the immediate vicinity of the first, the third and the fifth group of active conductor elements, respectively, at least the first part of the foil being folded about the magnetic field sensors along the first center line of the rectangle in such a manner that the second group of active conductor elements is situated in the immediate vicinity of the first magnetic field sensor. The fourth group of active conductor elements is situated in the immediate vicinity of the second magnetic field sensor, and the sixth group of active conductor elements is situated in the immediate vicinity of the third magnetic field sensor. Both groups of active conductor elements of one and the same conductor track which are situated near the same magnetic field sensor then extend to both sides of the plane of the sensor elements associated with the relevant magnetic field sensor in such a manner that the direction of an electric current flowing through the conductor track in the active conductor elements of one of the two groups opposes that in the active conductor elements of the other group. The foil subsequently is folded through an angle of 90° along a second center line of the rectangle which extends perpendicularly to the first center line so that the plane of the sensor elements of the second magnetic field sensor extends perpendicularly to the plane of the sensor elements of the first and the third magnetic field sensor.

BRIEF DESCRIPTION OF THE DRAWING

These and other aspects of the invention will be described in detail hereinafter with reference to the drawing in which:

FIG. 4 is a plan view of an embodiment of a sensor part with a magnetic field sensor and a magnetization coil, FIG. 5 is a perspective view of a part of a device in accordance with the invention in which three of the sensor parts shown in FIG. 4 are used.

DESCRIPTION OF THE PREFERRED EMBODIMENTS

Figure 1:
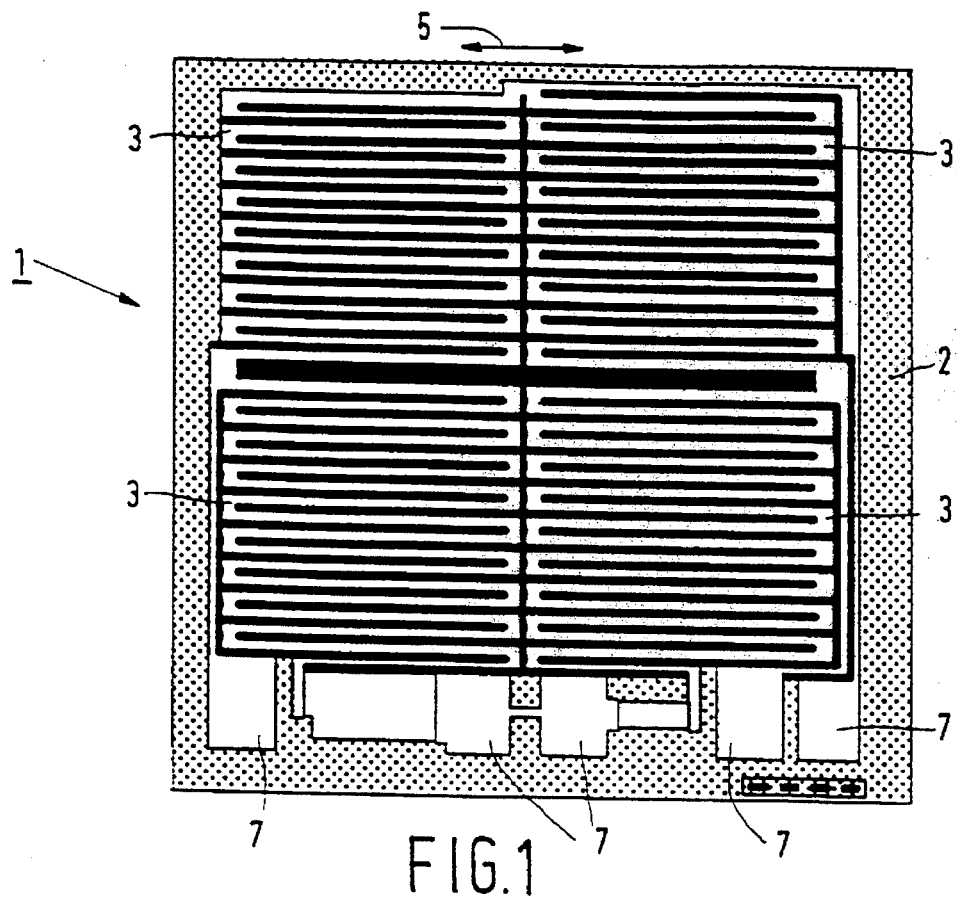
FIG. 1 is a plan view of a magnetic field sensor of a type suitable for use in the device in accordance with the invention.

FIG. 1 shows a magnetic field sensor 1 which is known per se and which utilizes the magnetoresistive effect. This is the phenomenon that the electric resistance of a current-carrying magnetic material changes in the presence of an external magnetic field. This change is caused by a rotation of the magnetization relative to the current direction. For example, in the case of permalloy (a ferromagnetic alloy containing 20% iron and 80% nickel), a rotation of the magnetization through 90° (caused by an external field extending perpendicular to the current direction) will lead to a resistance variation of from 2 to 3%. In the magnetic field sensor shown (Philips type KMZ 10) four magnetoresistive sensor elements 3 are provided on a silicon substrate 2. Each of the sensor elements 3 is formed by a meander-shaped strip of permalloy having a privileged direction of magnetization extending parallel to the longitudinal direction of the strip, i.e. in the direction of the arrow 5. The ends of the sensor elements 3 are interconnected so that they form the four branches of a Wheatstone bridge. The degree of unbalance of the bridge can be used as a measure of the variation of the magnetic field strength in the plane of the sensor elements 3 and perpendicular to the direction of an electric current flowing through the sensor elements. The bridge circuit formed by the sensor elements 3 can be connected, via connection points 7, to a power supply circuit on the one side and to a signal processing circuit on the other side.

Figure 2:
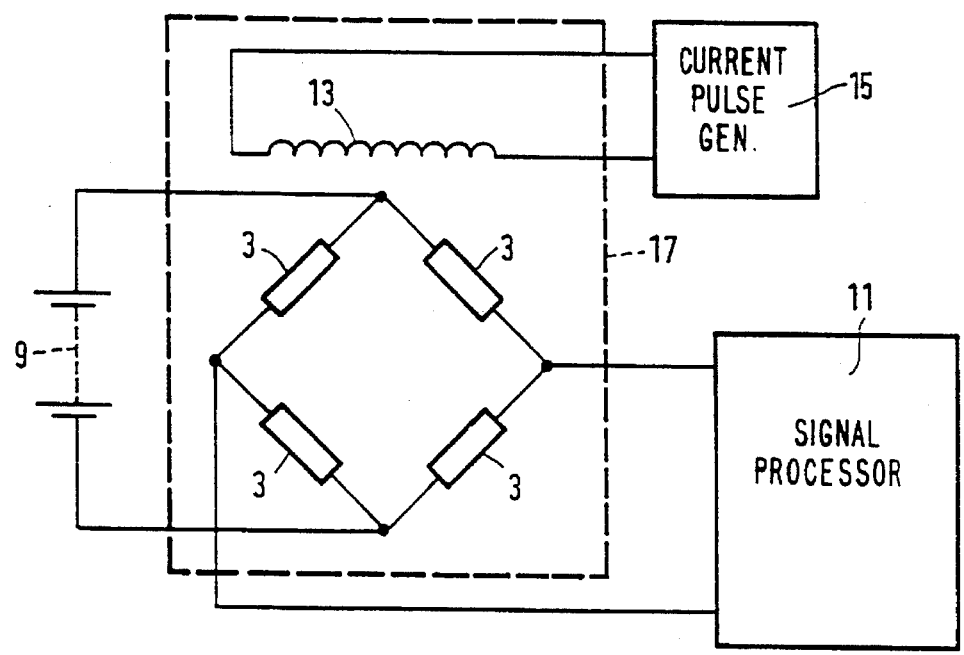
FIG. 2 shows a block diagram of an embodiment of the device in accordance with the invention.

FIG. 2 shows a block diagram of an embodiment of a device for measuring magnetic fields which utilizes a magnetic field sensor of the type shown in FIG. 1. The bridge circuit formed by the sensor elements 3 is connected to a power supply circuit 9 a battery in the present case) on the one side and to a signal processing circuit 11 on the other side. Examples of suitable signal processing circuits are described, for example, in the cited Philips Technical Publication 268. In the cited publication and also in DE-C-34 42 278 is also stated that for the elimination of offset effects it is desirable to arrange the magnetic field sensor in such a manner that the sensor elements 3 are subject to a magnetic field generated by a magnetization coil 13. The magnetization coil 13 is connected to a current pulse generator 15 which is arranged to apply current pulses of opposed current direction to the magnetization coil 13 in an alternating fashion, so that alternately oppositely directed magnetic fields are generated by the magnetization coil. The magnetization coil 13 is arranged so that the magnetic fields generated by this coil extend parallel to the privileged direction of magnetization 5 of the sensor elements 3. The properties of the magnetization coil 13 and the current intensity supplied by the current pulse generator 15 are chosen so that the magnetic fields generated are strong enough to reverse the direction of the internal magnetization of the sensor elements. In conjunction with the magnetization coil 13, the magnetic field sensor constitutes a sensor part 17 of the device.

Figure 3:
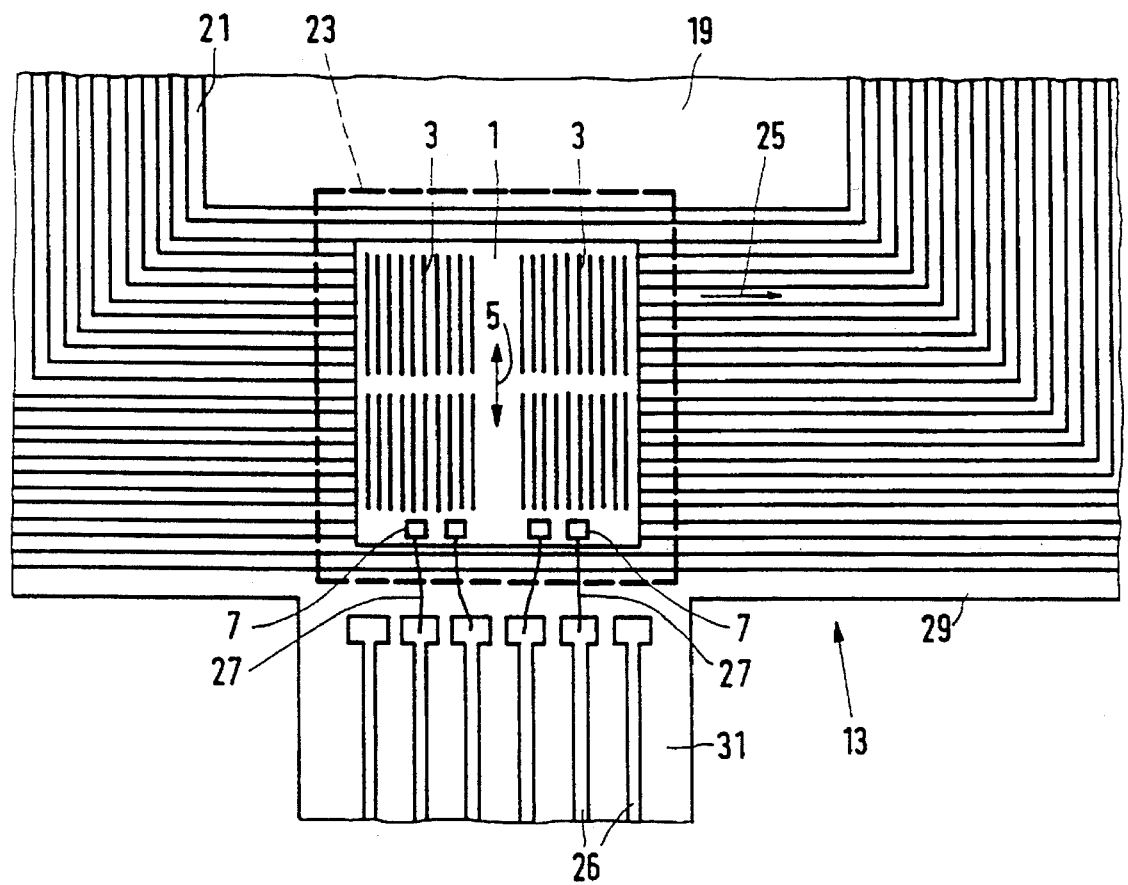
FIG. 3 illustrates the principle of the invention.

FIG. 3 shows the construction principle of a sensor part 17 for a device in accordance with the invention. The magnetization coil 13 comprises a substrate 19 which is made of an electrically insulating material and on which a conductor track 21 is provided. The substrate 19 may be made of a rigid material (for example, epoxy or aluminium oxide) or of a flexible material (for example, Kapton foil). The conductor track 21 consists of an electrically suitably conductive material, for example, copper or aluminium. A technique which is known per se for the manufacture of PCBs or film circuits can be used for the formation of the conductor track 21 on the substrate 19. The conductor track 21, being only partly visible in FIG. 3, extends approximately as a spiral on a main surface of the substrate 19. A number of parts of the conductor track 21 which extend in parallel on this surface constitute a group of active conductor elements which are enclosed by a dashed line in the Figure and denoted by the reference label 23. A current 25 flowing through the conductor track 21 has the same direction in all active conductor elements of the group 23. The magnetic field sensor 1 is mounted on the substrate 19 at the area of the group of active conductor elements 23, for example, by means of a suitable adhesive. The position of the magnetic field sensor 1 is chosen so that the plane of the sensor elements 3 extends parallel to the plane of the active conductor elements and that the privileged direction of magnetization 5 of the sensor elements extends perpendicularly to the longitudinal direction of the active conductor elements. As a result of this arrangement, the current 25 causes a magnetic field which is directed in the privileged direction 5 at the area of the sensor elements 3. For each current pulse 25 the direction of this magnetic field opposes the direction of the preceding current pulse so that the internal magnetization of the material of the sensor elements 3 will be reversed in response to each current pulse. However, a condition to be satisfied in this respect consists in that the magnetic field generated must be sufficiently strong, for example, at least 3 kA/m. In order to reduce the current intensity required in the conductor track 21 provided for this purpose, various solutions have been found. A first solution consists in the use of a multi-layer substrate with a conductor track 21 on each layer, all conductor tracks extending according to the same pattern, for example, the pattern shown in FIG. 3. Each conductor track 21 then comprises a group of active conductor elements 23 and these groups are arranged in mutually parallel planes on the same side of the plane of the sensor elements 3. The number of active conductor elements thus increases by a factor n when n conductor tracks are present. Thus, in order to generate a magnetic field of a given strength at the area of the magnetic field sensor 1, per conductor track a current intensity which is n times smaller suffices.

In addition to said conductor track 21 comprising the group of active conductor elements 23, further electric conductor tracks 26 are provided on the substrate 19. The further conductor tracks constitute connection conductors which can, inter alia, to connect the sensor elements 3 to the power supply circuit 9 and to the signal processing circuit 11 (FIG. 2). To this end, the relevant connection conductors 26 are connected to the connection points 7, for example, via bond wires 27. Some connection conductors 26 may also be connected to the conductor track 21. For the sake of simplicity, FIG. 3 does not show these connections. In the example shown the conductor track 21 is provided on a first part 29 of the substrate 19 and the connection tracks 26 are provided on a second part 31 of the substrate. If desired, small electronic components (for example, a switching transistor, a stabilization capacitor or an integrated circuit) can also be provided on the substrate 19 (not shown).

FIG. 4 shows an embodiment of a sensor part 17 operating according to the principle described with reference to FIG. 3, the part being shown on a reduced scale in order to make the first part 29 of the substrate 19 and the conductor track 21 provided thereon visible in its entirety. The substrate 19 of this embodiment is formed by a flexible foil. The conductor track 21 provided on the first part 29 of this substrate comprises two groups of active conductor elements 23 which are symmetrically situated relative to a symmetry line 33. The spiral-shaped shape of the conductor track 21 is chosen so that the active conductor elements in the two groups 23 extend parallel to one another and that the current direction 25 in one group opposes the current direction 25' in the opposite group. The magnetic field sensor 1 is mounted on the first part 29 of the substrate 19 at the area of the first group of active conductor elements 23, so that when a current is applied to the conductor track 21 in the manner described with reference to FIG. 3, the magnetic field sensor is subject to a magnetic field directed parallel to the privileged direction of the sensor elements 3. The connection points 7 of the magnetic field sensor 1 are connected, in the manner described with reference to FIG. 3, to some of the connection conductors 26 on the second part 31 of the foil 19. The conductor track 21 is connected to two other connection conductors 26. To this end, a first end 37 of the conductor track 21 changes over directly into the extreme left-hand connection conductor 26. The second end 39 is connected, via a metallized opening 41 in the first part 29 of the substrate 19 and a further conductor track on the rear of the substrate (not shown), to a metallized opening 43 which is in contact with the extreme right-hand connection conductor 26.

The embodiment shown in FIG. 4 is suitable for a second solution to the problem of reducing the current intensity in the conductor track 21. To this end, the first part 29 of the foil 19 is folded double along the symmetry line 33 as indicated by the arrow 35. As a result, the second group of active conductor elements 23 is situated on top of the magnetic field sensor 1, i.e. to the other side of the plane of the sensor elements 3 compared with the first group. The two groups 23 thus constitute a sandwich construction in conjunction with the intermediate magnetic field sensor 1. Because the current directions 25 and 25' in the two groups of active conductor elements 23 are opposed, the active conductor elements generate magnetic fields in the same direction at the area of the sensor elements 3. The effect of the two groups 23, therefore, amounts to twice the effect of a single group, so that the current intensity in the conductor track 21 can be halved. Evidently, if desired this step can be combined with the provision of more conductor tracks 21 in different layers of the substrate 19 as described with reference to FIG. 3. A further advantage of the folding of the foil 19 along the symmetry line 33 consists in that the dimensions of the sensor part 17 are thus further reduced.

In the embodiment shown in FIG. 4 the conductor track 21 is shaped as a rectangular (notably square) spiral. However, this shape is not absolutely necessary. It is merely necessary that the two groups of active conductor elements 23 are symmetrically arranged relative to a symmetry line 33 and that the conductor elements in these groups extend in parallel. The parts of the conductor track 21 which interconnect the two groups of active conductor elements 23 (at the left and the right in FIG. 4) may take an arbitrary course, for example, in the form of a semi-circle.

FIG. 5 is a perspective view of a combination of three sensor parts 17, each of which is constructed as described with reference to FIG. 4. Each sensor part 17 is arranged, together with the magnetic field sensor 1 enclosed by the first part 29 of the foil 19, in a holder 45 which is shaped as a rectangular parallelepiped. The second parts 31 of the foils (supporting the connection conductors 26 which are not shown in FIG. 5) project from the holders 45. The three holders 45 are connected to one another in such a manner that the privileged directions of magnetization of the sensor elements 3 of the three magnetic field sensors 1 extend in mutually perpendicular directions. The three magnetic field sensors 1, therefore, are sensitive to mutually perpendicular magnetic fields. As a result, this combination is particularly suitable for use in a compass whereby three mutually perpendicular components of the terrestrial magnetic field must be detected. Evidently, if only two mutually perpendicular components need be detected, it suffices for the combination to comprise only two sensor parts 17 which are mounted so that the privileged directions of the sensor elements of the two magnetic field sensors included therein extend mutually perpendicularly. In the embodiment shown in FIG. 5 the three holders 45 are arranged so that the planes of the sensor elements 3 of the three magnetic field sensors 1 extend mutually perpendicularly. Evidently, two of the three magnetic field sensors can also be arranged mutually in parallel and be oriented so that the privileged directions of their sensor elements extend perpendicularly to one another. The embodiment shown, however, is the most compact embodiment to be obtained when use is made of three sensor parts 17 in conformity with FIG. 4.

Figure 6:
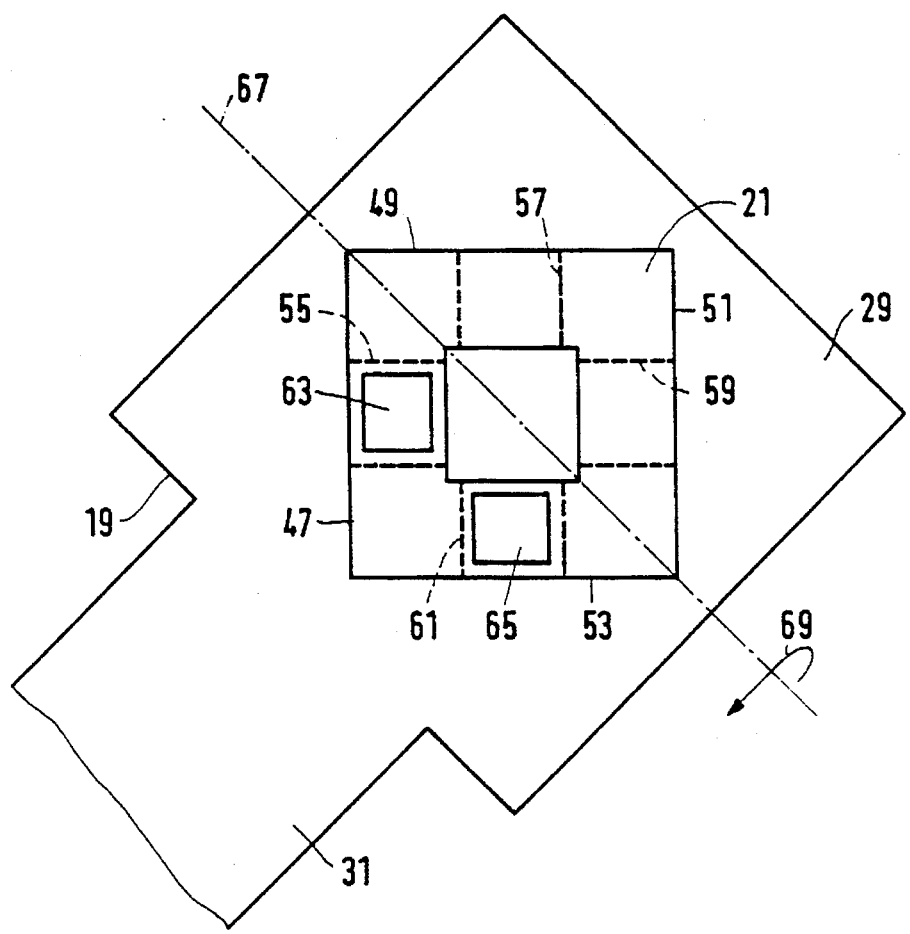
FIG. 6 is a plan view of an embodiment comprising two magnetic field sensors with magnetization coils mounted on a common substrate.

The volume can be further reduced by providing more than one magnetic field sensor on a single substrate. FIG. 6 shows an embodiment comprising two magnetic field sensors on one substrate 19 which again consists of a flexible foil of an electrically insulating material. On one of the main surfaces of the first part 29 of the foil there is again provided a conductor track 21, only the contour of which is indicated in the Figure. This contour is shaped as a rectangle (a square in this case) having a first side 47, a second side 49, a third side 51 and a fourth side 53. The first side 47 and the second side 49 adjoin one another, the third side 51 being situated opposite the first side and the fourth side 53 is situated opposite the second side. The conductor track 21 forms a rectangular spiral which follows the described contour. It comprises first, second, third and fourth groups of active conductor elements 55, 57, 59 and 61 which are situated near the first side 47, the second side 49, the third side 51 and the fourth side 53, respectively. The active conductor elements in each of these groups extend parallel to the associated side of the rectangle. At the area of the first group of active conductors 55 a first magnetic field sensor 63 is mounted on the foil 19, whereas at the area of the fourth group 61 a second magnetic field sensor 65 is mounted on the foil. The orientation of these magnetic field sensors relative to the relevant groups of active conductors is the same as in the FIGS. 3 and 4. An electric current flowing through the conductor track 21 follows the sides of the rectangle in the clock-wise or counterclockwise direction, so that the current direction in oppositely situated groups of active conductor elements is always opposed.

On one of the main surfaces of the second part 31 of the foil 19 there are again provided connection conductors (not shown in FIG. 6) which are connected, in the manner described with reference to FIG. 5, to the magnetic field sensors 63, 65 and the conductor track 21. In order to keep the connections between these sensors and the connection conductors as short as possible, the second part 31 of the foil 19 preferably adjoins the first side 47 and the fourth side 53 of the rectangle.

The first part 29 of the foil 19 is folded along a diagonal 67 of the rectangle in such a manner that the second group of active conductors 57 is situated on the first magnetic field sensor 63 and the third group 59 on the second magnetic field sensor 65. Each magnetic field sensor 63, 65 is thus situated between two groups of active conductor elements which extend in two planes which are parallel to the plane of the sensor elements. The current direction in the two groups of active conductors is opposed and the two groups constitute, together with the relevant magnetic field sensor, a sandwich construction having the same properties as described with reference to FIG. 4.

Figure 7:
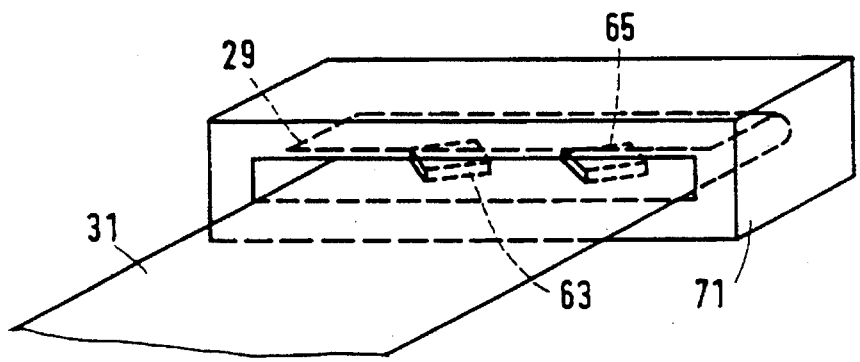
FIG. 7 is a perspective view of a part of a device in accordance with the invention, comprising a holder in which a sensor part as shown in FIG. 6 is arranged.

Due to the orientation of the two magnetic field sensors 63, 65 relative to the sides 47, 53 of the rectangle, the privileged directions of magnetization of the sensor elements of these sensors extend mutually perpendicularly, so that they are sensitive to mutually perpendicular magnetic fields. Therefore, the described combination is very well suitable for detecting, for example, two mutually perpendicular components of the terrestrial magnetic field, so that it can be advantageously used in a magnetic compass. To this end, the first part 29 of the foil 19 may be arranged, for example together with the first and second magnetic field sensors 63 and 65 mounted thereon, in a holder 71 as shown in FIG. 7. The second part 31 of the foil projects from the holder 71. The holder 71 may be very small and light and have a volume of, for example, a few mm³ and a weight of a few grams. As a result, it is very suitable for mounting outside the body of a vehicle, for example at the tip of an aerial mounted on the vehicle. The connection conductors 26 can then be connected, via a cable extending along the aerial, to the power supply and signal processing circuits 9 and 11 accommodated within the vehicle.

Figure 8:
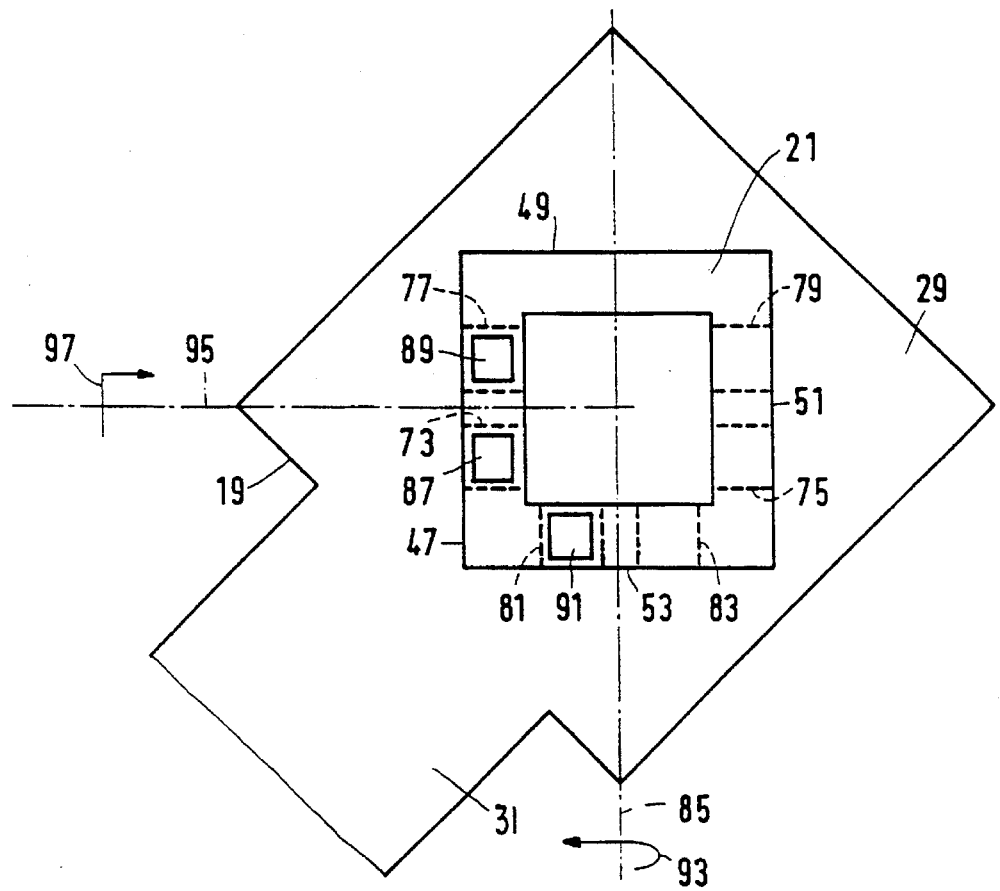
FIG. 8 is a plan view of an embodiment comprising three magnetic field sensors with magnetization coils mounted on a common substrate.
Figure 9:
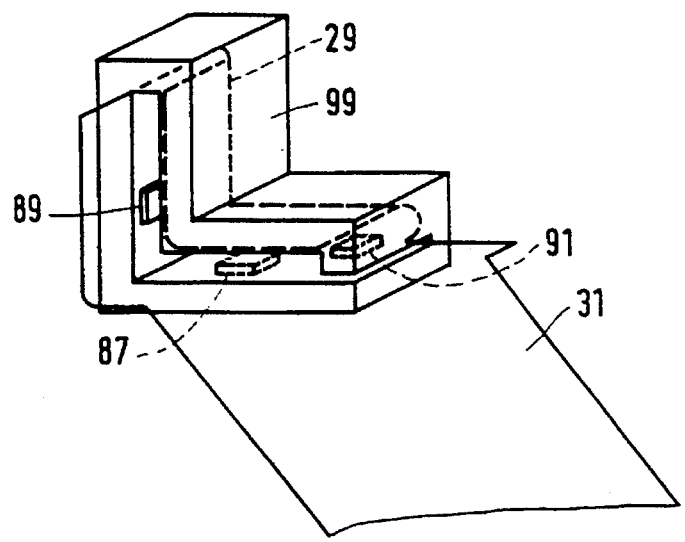
FIG. 9 is a perspective view of a part of a device in accordance with the invention, comprising a holder in which a sensor part as shown in FIG. 8 is arranged.

FIGS. 8 and 9 show an embodiment which is related to the embodiment shown in the FIGS. 6 and 7 but which is suitable for the detection of three mutually perpendicular magnetic fields, for example, the three components of the terrestrial field. FIG. 8 shows a foil 19, having a first portion 29 and a second portion 31, which strongly resembles the foil shown in FIG. 6. On the first part 29 them is provided a conductor track 21 which extends helically, in substantially the same way as in FIG. 6, with a rectangular contour having a first side 47, a second side 49, a third side 51 and a fourth side 53. The current directions in parts of the conductor track 21 which extend near oppositely situated sides of the rectangle are opposed again. The conductor track 21 comprises six groups of active conductor elements, that is to say a first group 73 and a second group 75 which are situated near oppositely situated points of the first side 47 and the third side 51 of the rectangle, a third group 77 and a fourth group 79 which are also situated near oppositely situated points of the first side and the third side, and a fifth group 81 and a sixth group 83 which are symmetrically situated relative to a first center line 85, extending parallel to the first side, near the fourth side 53. A center line of a rectangle is a line which divides the rectangle into two identical rectangles. At the area of the first group 73, the third group 77 and the fifth group 81, a first magnetic field sensor 87, a second magnetic field sensor 89 and a third magnetic field sensor 91, respectively, are mounted on the foil 19, the orientations of the magnetic field sensors relative to the active conductor elements corresponding to those of the magnetic field sensors shown in the preceding Figures.

The first part 29 of the foil 19 is subsequently folded along the first center line 85 in such a manner that the second group of active conductor elements 75 is situated on the first magnetic field sensor 87, the fourth group 79 is situated on the second magnetic field sensor 89, and the sixth group 83 is situated on the third magnetic field sensor 91. The method of folding is indicated by the arrow 93. The groups then constitute, in conjunction with the respective magnetic field sensors, sandwich constructions having the properties described with reference to the preceding Figures. Subsequently, the first part 29 of the foil 19 is folded through 90° along a second center line 95 as indicated by the arrow 97. The second center line 95 extends perpendicularly to the first center line 85 and, after the last folding operation the plane of the sensor elements of the second magnetic field sensor 89 extends perpendicularly to the plane of the sensor elements of the first magnetic field sensor 87 and the third magnetic field sensor 91. The orientation of the three magnetic field sensors 87, 89 and 91 is then such that they are sensitive to three mutually perpendicular magnetic fields. The assembly thus formed, therefore, is particularly suitable for use in a magnetic compass intended to detect the three components of the terrestrial magnetic field.

FIG. 9 shows a holder 99 in which the first part 29 of the foil 19, folded in the described manner, is accommodated so that the second part 31 with the connection conductors projects from the holder. The dimensions and the weight of the holder 99 are only slightly larger than those of the holder shown in FIG. 7.

As has already been stated, because of the small dimensions of the sensor part the described device is particularly suitable for use in a magnetic compass for a vehicle, for example, a car, boat or aeroplane. Other feasible applications are, for example in a compass built into a watch (notably the version of FIG. 7 which is sensitive to two magnetic field components), or in a self-contained compass intended as a sporting or car accessory. Further feasible applications are terrestrial field compensation control for high resolution image monitors and traffic control systems (for example, sensors embedded in road surfaces).

We claim:

1. A device for measuring magnetic fields, comprising: at least one magnetic field sensor having a number of magnetoresistive sensor elements arranged in one plane and which have the same privileged directions of magnetization, said magnetoresistive sensor elements being connected to a power supply circuit and to a signal processing circuit, a magnetization coil arranged to generate an auxiliary magnetic field in the vicinity of the at least one magnetic field sensor, wherein the magnetization coil comprises a substrate made of an electrically insulating material on which there is provided at least one approximately spiral-shaped electric conductor track which comprises at least one group of active conductor elements formed by a number of parts of the conductor track which extend in parallel in a plane on a surface of the substrate, an electric current flowing through the conductor track having the same direction in all active conductor elements of the group, wherein the substrate also comprises a number of further electric conductor tracks which constitute connection conductors for connecting the sensor elements to the power supply circuit and to the signal processing circuit, the magnetic field sensor being mounted on the substrate in the immediate vicinity of at least one group of active conductor elements in a position such that the plane of the sensor elements extends substantially parallel to the plane of the active conductor elements and the privileged direction of magnetization of the sensor elements extends perpendicular to a longitudinal direction of the active conductor elements.

2. A device as claimed in claim 1 wherein at least two conductor tracks are provided on the substrate, each track comprising at least one group of active conductor elements, corresponding groups of active conductor elements, associated with different conductor tracks, extending in mutually parallel planes which are situated to the same side of the plane of the sensor elements of a magnetic field sensor mounted in their immediate vicinity.

3. The device as claimed in claim 1 wherein the magnetoresistive sensor elements comprise four magnetoresistor sensor elements connected together as a Wheatstone bridge having input terminals coupled to said power supply circuit and output terminals coupled to said signal processing circuit.

4. The device as claimed in claim 3 wherein said electric conductor track is coupled to a source of current pulses of alternate opposite polarity.

5. A device for measuring magnetic fields, comprising: at least one magnetic field sensor having a number of magnetoresistive sensor elements arranged in one plane and which have the same privileged directions of magnetization, said magnetoresistive sensor elements being connected to a power supply circuit and to a signal processing circuit, a magnetization coil arranged to generate an auxiliary magnetic field in the vicinity of the at least one magnetic field sensor, wherein the magnetization coil comprises a substrate made of an electrically insulating material on which there is provided at least one approximately spiral-shaped electric conductor track which comprises at least one group of active conductor elements which extend in parallel in a plane on a surface of the substrate, an electric current flowing through the conductor track having the same direction in all active conductor elements of the group, the magnetic field sensor being mounted on the substrate in the immediate vicinity of at least one group of active conductor elements in a position such that the plane of the sensor elements extends substantially parallel to the plane of the active conductor elements and the privileged direction of magnetization of the sensor elements extends perpendicular to a longitudinal direction of the active conductor elements, wherein the substrate comprises a flexible foil which includes a first part provided with a conductor track on at least one of its main surfaces, which conductor track comprises two groups of active conductor elements, and a second part which supports connection conductors on at least one of its main surfaces, the magnetic field sensor being mounted on the first part of the foil in the immediate vicinity of one of the two said groups of active conductor elements, at least the first part of the foil being folded about the magnetic field sensor in a manner such that the second group of active conductor elements is also situated in the immediate vicinity of the magnetic field sensor and the two groups of active conductor elements of one and the same conductor track extend on both sides of the plane of the sensor elements associated with the magnetic field sensor in a manner such that an electric current flowing through the conductor track in the active conductor elements of one of the two groups opposes that in the active conductor elements of the other group.

6. A device as claimed in claim 5 which further comprises at least two substrates, on each substrate of which there is mounted a respective magnetic field sensor, the magnetic field sensors being oriented relative to one another such that the privileged directions of the sensor elements of the magnetic field sensors extend in mutually perpendicular directions.

7. A device for measuring magnetic fields, comprising: at least one magnetic field sensor having a number of magnetoresistive sensor elements arranged in one plane and which have the same privileged directions of magnetization, said magnetoresistive sensor elements being connected to a power supply circuit and to a signal processing circuit, a magnetization coil arranged to generate an auxiliary magnetic field in the vicinity of the at least one magnetic field sensor, wherein the magnetization coil comprises a substrate made of an electrically insulating material on which there is provided at least one approximately spiral-shaped electric conductor track which comprises at least one group of active conductor elements which extend in parallel in a plane on a surface of the substrate, an electric current flowing through the conductor track having the same direction in all active conductor elements of the group, the magnetic field sensor being mounted on the substrate in the immediate vicinity of at least one group of active conductor elements in a position such that the plane of the sensor elements extends substantially parallel to the plane of the active conductor elements and the privileged direction of magnetization of the sensor elements extends perpendicular to a longitudinal direction of the active conductor elements, wherein the substrate includes a flexible foil which comprises a first part which supports, on at least one of its main surfaces, a conductor track which extends approximately as a spiral rectangle and which comprises four groups of active conductor elements, the first and the second group being situated near adjoining first and second sides of the rectangle, the third and the fourth group being situated near third and fourth sides of the rectangle, the latter sides being situated opposite the first and the second side, respectively, the conductor elements in each of the groups extending parallel to the associated side of the rectangle, the flexible foil also comprising a second part which supports the connection conductors on at least one of its main surfaces, a first and a second magnetic field sensor being mounted on the foil in the immediate vicinity of the first and the fourth group of active conductor elements, respectively, at least the first part of the foil being folded about the magnetic field sensors along a diagonal of the rectangle such that the second group of active conductors is situated in the immediate vicinity of the first magnetic field sensor and the third group of active conductors is situated in the immediate vicinity of the second magnetic field sensor, the two groups of active conductor elements of one and the same conductor track which are situated near the same magnetic field sensor then extending on both sides of the plane of the sensor elements associated with the relevant magnetic field sensor such that an electric current flowing through the conductor track in the active conductor elements of one of the two groups opposes that in the active conductor elements of the other group.

8. A device for measuring magnetic fields, comprising: at least one magnetic field sensor having a number of magnetoresistive sensor elements arranged in one plane and which have the same privileged directions of magnetization, said magnetoresistive sensor elements being connected to a power supply circuit and to a signal processing circuit, a magnetization coil arranged to generate an auxiliary magnetic field in the vicinity of the at least one magnetic field sensor, wherein the magnetization coil comprises a substrate made of an electrically insulating material on which there is provided at least one approximately spiral-shaped electric conductor track which comprises at least one group of active conductor elements which extend in parallel in a plane on a surface of the substrate, an electric current flowing through the conductor track having the same direction in all active conductor elements of the group, the magnetic field sensor being mounted on the substrate in the immediate vicinity of at least one group of active conductor elements in a position such that the plane of the sensor elements extends substantially parallel to the plane of the active conductor elements and the privileged direction of magnetization of the sensor elements extends perpendicular to a longitudinal direction of the active conductor elements, wherein the substrate includes a flexible foil which comprises a first part which supports, on at least one of its main surfaces, a conductor track which extends approximately as a spiral rectangle and which comprises six groups of active conductor elements, the first and the second group being situated near oppositely situated points of oppositely situated first and third sides of the rectangle, the third and the fourth group being situated near oppositely situated points of the first and third sides of the rectangle, whereas the fifth and the sixth group are situated near a fourth side of the rectangle such that they are symmetrical relative to a first center line of the rectangle which extends parallel to the first side, the conductor elements in each of the groups extending parallel to the associated side of the rectangle, the flexible foil also comprising a second part which supports the connection conductors on at least one of its main surfaces, a first, a second and a third magnetic field sensor being mounted on the foil in the immediate vicinity of the first, the third and the fifth group of active conductor elements, respectively, at least the first part of the foil being folded about the magnetic field sensors along the first center line of the rectangle, such that the second group of active conductor elements is situated in the immediate vicinity of the first magnetic field sensor, the fourth group of active conductor elements is situated in the immediate vicinity of the second magnetic field sensor, and the sixth group of active conductor elements is situated in the immediate vicinity of the third magnetic field sensor, both groups of active conductor elements of one and the same conductor track which are situated near the same magnetic field sensor then extending on both sides of the plane of the sensor elements associated with the relevant magnetic field sensor such that the direction of an electric current flowing through the conductor track in the active conductor elements of one of the two groups opposes that in the active conductor elements of the other group, the foil subsequently being folded through an angle of 90° along a second center line of the rectangle which extends perpendicularly to the first center line so that the plane of the sensor elements of the second magnetic field sensor extends perpendicularly to the plane of the sensor elements of the first and the third magnetic field sensor.

9. A device for measuring magnetic fields comprising:
a magnetic field sensor having a number of magnetoresistive sensor elements arranged in a plane and which have the same privileged directions of magnetization, said magnetoresistive sensor elements being connected to a power supply circuit and to a signal processing circuit, a magnetization coil arranged to generate an auxiliary magnetic field in the vicinity of the magnetic field sensor, wherein the magnetization coil comprises an electrically insulating substrate on which is provided at least one approximately spiral-shaped electric conductor track including at least one group of active conductor elements extending in parallel in a plane on a surface of the substrate, wherein an electric current flowing through the conductor track has the same direction in all active conductor elements of the group, the magnetic field sensor being mounted on the substrate in the immediate vicinity of at least one group of active conductor elements such that the plane of the sensor elements extends substantially parallel to the plane of the active conductor elements and the privileged direction of magnetization of the sensor elements extends perpendicular to a longitudinal direction of the active conductor elements, a second electrically insulating substrate supporting a second approximately spiral-shaped electric conductor track having at least one group of active conductor elements extending in parallel in a plane on a surface of the second substrate, corresponding groups of active conductor elements associated with different conductor tracks extending in mutually parallel planes situated on the same side of the plane of the sensor elements of a magnetic field sensor mounted in their immediate vicinity.

10. A device for measuring magnetic fields comprising:
a magnetization coil including first and second electrically insulating substrates each of which comprises at least one approximately spiral-shaped electric conductor track which includes at least one group of active conductor elements extending in parallel in a plane on a surface of the respective substrate, means for applying an electric current to the conductor track which has the same direction in all active conductive conductor elements of the group, first and second magnetic field sensors mounted on said first and second substrates, respectively, each magnetic field sensor including a number of magnetoresistive sensor elements arranged in a plane and which have the same privileged directions of magnetization, said magnetoresistive sensor elements being connected to a power supply circuit and to a signal processing circuit, each magnetic field sensor being mounted in the vicinity of a group of active conductor elements on the first and second substrates in a position such that the plane of the sensor elements extend substantially parallel to the plane of the active conductor elements and the privileged direction of magnetization of the sensor elements extends perpendicular to a longitudinal direction of the active conductor elements, and wherein the first and second magnetic field sensors are oriented relative to one another such that the privileged direction of magnetization of the sensor elements of the first magnetic field sensor extend in a perpendicular direction to the direction of magnetization of the sensor elements of the second magnetic field sensor.

11. The device as claimed in claim 10 further comprising a third electrically insulating substrate which comprises at least one approximately spiral-shaped electric conductor track which includes at least one group of active conductor elements extending in parallel in a plane on a surface of the third substrate, the electric current applying means supplying a current to said conductor track having the same direction in all active conductor elements of the group, a third magnetic field sensor mounted on the third substrate and oriented relative to the first and second magnetic field sensors such that the privileged directions of magnetization of the sensor elements of the first, second and third magnetic field sensors extend in mutually perpendicular directions.

12. A device for measuring magnetic fields comprising:
a magnetic field sensor including a number of magnetoresistive sensor elements arranged in a plane and which have the same privileged directions of magnetization, means for coupling said magnetoresistive sensor elements to a power supply circuit and to a signal processing circuit, a magnetization coil arranged to generate an auxiliary magnetic field for the magnetoresistive sensor elements of the magnetic field sensor, wherein the magnetization coil comprises an electrically insulating substrate supporting at least one approximately spiral-shaped electric conductor track which includes at least one group of active conductor elements extending in parallel in a plane on a surface of the substrate, means for applying an electric current to the conductor track which has the same direction in all active conductor elements of the group, the magnetic field sensor being mounted on the substrate in the vicinity of at least one group of active conductor elements so that the plane of the sensor elements extends substantially parallel to the plane of the active conductor elements and the privileged direction of magnetization of the sensor elements extends perpendicular to a longitudinal direction of the active conductor elements.

* * * * *